(12) United States Patent
Cecchin et al.

(10) Patent No.: US 10,252,176 B1
(45) Date of Patent: Apr. 9, 2019

(54) ADAPTER FOR CONNECTING A TOY BUILDING BLOCK TO A SNAP-TOGETHER ELECTRONIC TOY

(71) Applicant: ELENCO ELECTRONICS, INC., Wheeling, IL (US)

(72) Inventors: Gerald Joseph Cecchin, Buffalo Grove, IL (US); Marc C. Lehner, Glenview, IL (US); Alexander R. Matz, Wheeling, IL (US)

(73) Assignee: ELENCO ELECTRONICS, INC., Wheeling, IL (US)

( * ) Notice: Subject to any disclaimer, the term of this patent is extended or adjusted under 35 U.S.C. 154(b) by 0 days.

(21) Appl. No.: 15/722,558

(22) Filed: Oct. 2, 2017

(51) Int. Cl.
| A63H 33/04 | (2006.01) |
| G09B 23/18 | (2006.01) |
| H05K 7/00  | (2006.01) |
| A63H 33/26 | (2006.01) |
| A63H 33/06 | (2006.01) |

(52) U.S. Cl.
CPC ......... *A63H 33/042* (2013.01); *A63H 33/062* (2013.01); *A63H 33/26* (2013.01); *H05K 7/005* (2013.01)

(58) Field of Classification Search
CPC ..... A63H 33/042; A63H 33/086; A63H 33/26
USPC ............ 434/224; 446/85, 91, 118, 484
See application file for complete search history.

(56) References Cited

U.S. PATENT DOCUMENTS

| 4,894,040 A * | 1/1990 | Bach ............... A63H 33/042 385/147 |
| 5,742,486 A * | 4/1998 | Yangkuai ........ A63H 33/042 361/807 |
| 5,779,515 A * | 7/1998 | Chung ............. A63H 33/04 446/102 |
| 6,443,796 B1 * | 9/2002 | Shackelford ..... A63H 33/042 273/237 |
| 6,805,605 B2 * | 10/2004 | Reining ........... A63H 33/086 446/484 |

(Continued)

FOREIGN PATENT DOCUMENTS

CN     105617685 A     6/2016

OTHER PUBLICATIONS

"The new Snap Circuits Bric kit adds lighting, audio & moving parts to your LEGO builds"(KAHN) Feb. 15, 2018 (Feb. 15, 2018); retrieved from internet Nov. 23, 2018; <URL=https://9to5toys.com/2018/02/15/snap-circuits-bric-lego/>; entire documents.

(Continued)

*Primary Examiner* — Alexander Niconovich
(74) *Attorney, Agent, or Firm* — Klintworth & Rozenblat IP LLP (57) ABSTRACT

A toy is disclosed. The toy includes a toy building block, a snap-together electronic toy, and an adapter. The toy building block includes a first building block mating member. The snap-together electronic toy includes a first snap-fitting member. The adapter is configured to connect the toy building block to the snap-together electronic toy. The adapter includes a second building block mating member which is configured to mate with the first building block mating member of the toy building block, and a second snap-fitting member which is configured to mate with the first snap-fitting member of the snap-together electronic toy.

22 Claims, 8 Drawing Sheets

(56) References Cited

U.S. PATENT DOCUMENTS

| | | | | |
|---|---|---|---|---|
| 7,144,255 B2* | 12/2006 | Seymour | ............. | H01R 13/627 |
| | | | | 439/49 |
| 7,273,377 B2* | 9/2007 | Seymour | ............ | H01R 13/6273 |
| | | | | 434/118 |
| 7,611,357 B2* | 11/2009 | Han | ...................... | H01R 11/30 |
| | | | | 434/224 |
| 7,666,054 B2* | 2/2010 | Glickman | ............ | A63H 33/082 |
| | | | | 446/120 |
| 8,221,182 B2* | 7/2012 | Seymour | ............... | A63H 33/04 |
| | | | | 446/120 |
| 8,371,894 B1* | 2/2013 | Rosen | ................. | A63H 33/086 |
| | | | | 446/102 |
| 8,864,546 B1* | 10/2014 | Capriola | ............. | A63H 33/042 |
| | | | | 331/3 |
| 8,991,040 B2* | 3/2015 | Chen | ....................... | H01R 9/28 |
| | | | | 29/592.1 |
| 9,168,464 B2* | 10/2015 | Karunaratne | ....... | A63H 33/086 |
| 9,419,378 B2* | 8/2016 | Bdeir | ................ | H01R 13/6205 |
| 9,597,607 B2* | 3/2017 | Bdeir | ................ | H01R 13/6205 |
| 9,812,034 B2* | 11/2017 | Shim | ................... | G09B 23/185 |
| 2009/0215357 A1* | 8/2009 | Seligman | ............ | A63H 33/042 |
| | | | | 446/127 |
| 2016/0220919 A1* | 8/2016 | Almog | ................ | A63H 33/086 |

OTHER PUBLICATIONS

International Search Report and Written Opinion for International Patent Application No. PCT/US18/53821 dated Jan. 8, 2019, 10 pages.

* cited by examiner

ADAPTER FOR CONNECTING A TOY BUILDING BLOCK TO A SNAP-TOGETHER ELECTRONIC TOY

FIELD OF THE DISCLOSURE

This disclosure relates to adapters which are configured to connect toy building blocks to snap-together electronic toys.

BACKGROUND

Toy building blocks are configured to be mated to one another to build various structures. Snap-together electronic toys are configured to be snapped-together to complete various electric circuits. However, typically toy building blocks and snap-together electronic toys are not configured to be attached to one another. This reduces the ways these toys can be used and limits the structures that can be built.

An adapter, toy, and method is needed to allow toy building blocks and snap-together electronic toys to be attached to one another in order to overcome one or more limitations of using toy building blocks and snap-together electronic toys together.

SUMMARY

In one embodiment, a toy is disclosed. The toy includes a toy building block, a snap-together electronic toy, and an adapter. The toy building block includes a first building block mating member. The snap-together electronic toy includes a first snap-fitting member. The adapter is configured to connect the toy building block to the snap-together electronic toy. The adapter includes a second building block mating member which is configured to mate with the first building block mating member of the toy building block, and a second snap-fitting member which is configured to mate with the first snap-fitting member of the snap-together electronic toy.

In another embodiment, a toy is disclosed. The toy includes a toy building block, a snap-together electronic toy, and an adapter. The toy building block includes a first building block mating member. The snap-together electronic toy includes a plurality of electrically conductive electrical components configured to be electrically connected together with snap-fits to form an electrical circuit. The plurality of electrically conductive electrical components include at least one power source, at least one powered component, and a first snap-fitting member comprising a flexible, biasing member. The adapter is configured to connect the toy building block to the snap-together electronic toy. The adapter includes a second building block mating member which is configured to mate with the first building block mating member of the toy building block, and a second snap-fitting member which is configured to mate with the first snap-fitting member of the snap-together electronic toy.

In still another embodiment, a method of assembling a toy is disclosed. In one step a first building block mating member of an adapter is connected to a second building block mating member of a toy building block. In another step, a first snap-fitting member of the adapter is connected to a second snap-fitting member of a snap-together electronic toy.

The scope of the present disclosure is defined solely by the appended claims and is not affected by the statements within this summary.

BRIEF DESCRIPTION OF THE DRAWINGS

The disclosure can be better understood with reference to the following drawings and description. The components in the figures are not necessarily to scale, emphasis instead being placed upon illustrating the principles of the disclosure.

DETAILED DESCRIPTION

Figure 1A:
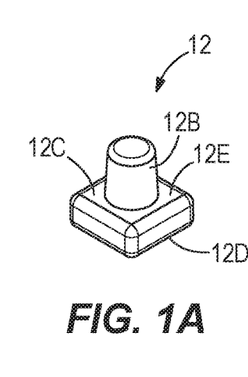
FIGS. 1A and 1B illustrate perspective and side views of one embodiment of an adapter to connect a toy building block to a snap-together electronic toy.
Figure 1B:
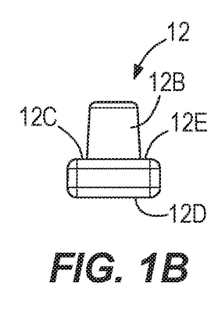
Figure 2A:
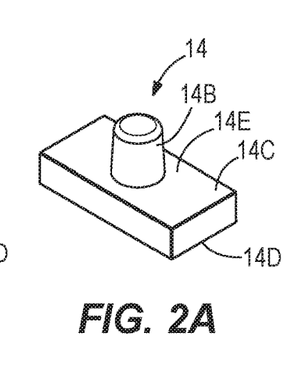
FIGS. 2A and 2B illustrate perspective and side views of another embodiment of an adapter to connect a toy building block to a snap-together electronic toy.
Figure 2B:
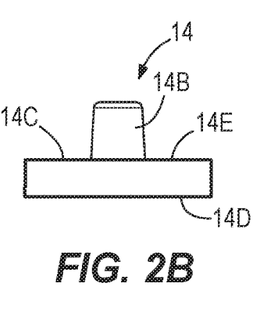
Figure 3A:
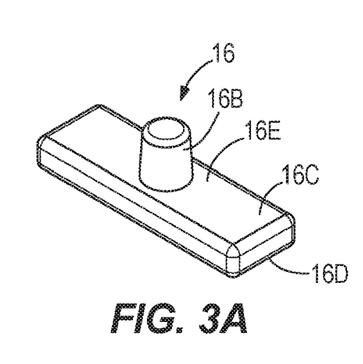
FIGS. 3A and 3B illustrate perspective and side views of another embodiment of an adapter to connect a toy building block to a snap-together electronic toy.
Figure 3B:
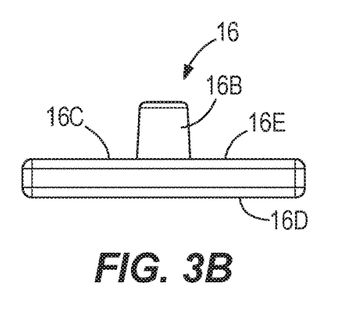
Figure 4A:
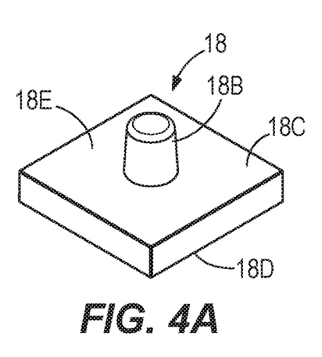
FIGS. 4A and 4B illustrate perspective and side views of another embodiment of an adapter to connect a toy building block to a snap-together electronic toy.
Figure 4B:
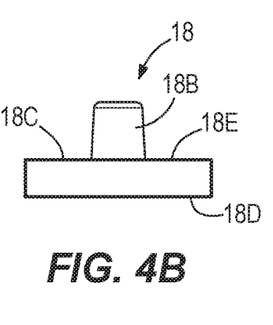
Figure 5A:
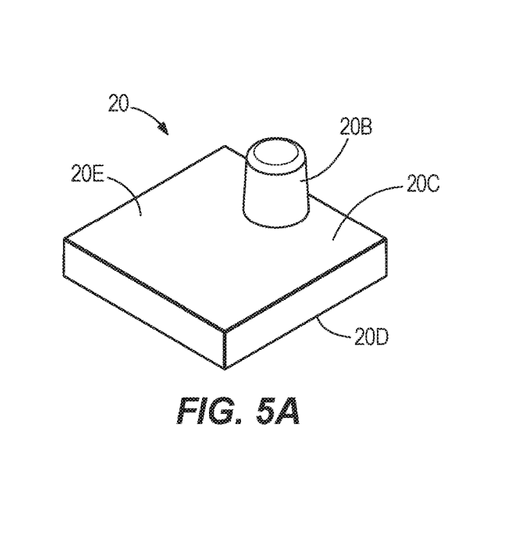
FIGS. 5A and 5B illustrate perspective and side views of another embodiment of an adapter to connect a toy building block to a snap-together electronic toy.
Figure 5B:
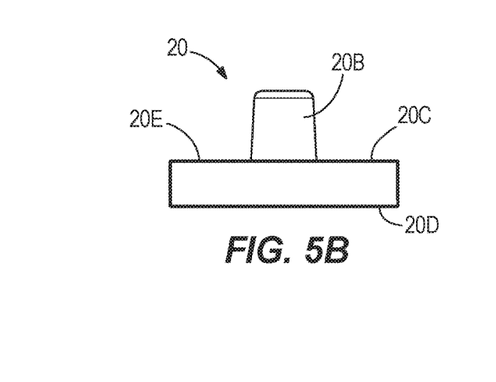
Figure 6A:
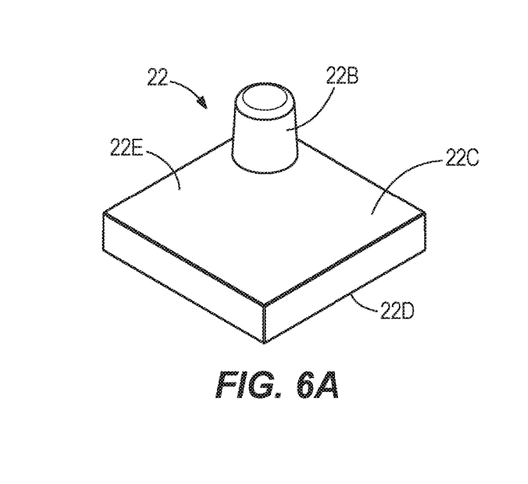
FIGS. 6A and 6B illustrate perspective and side views of another embodiment of an adapter to connect a toy building block to a snap-together electronic toy.
Figure 6B:
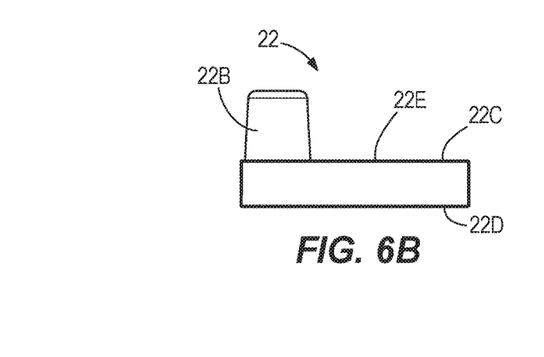
Figure 7:
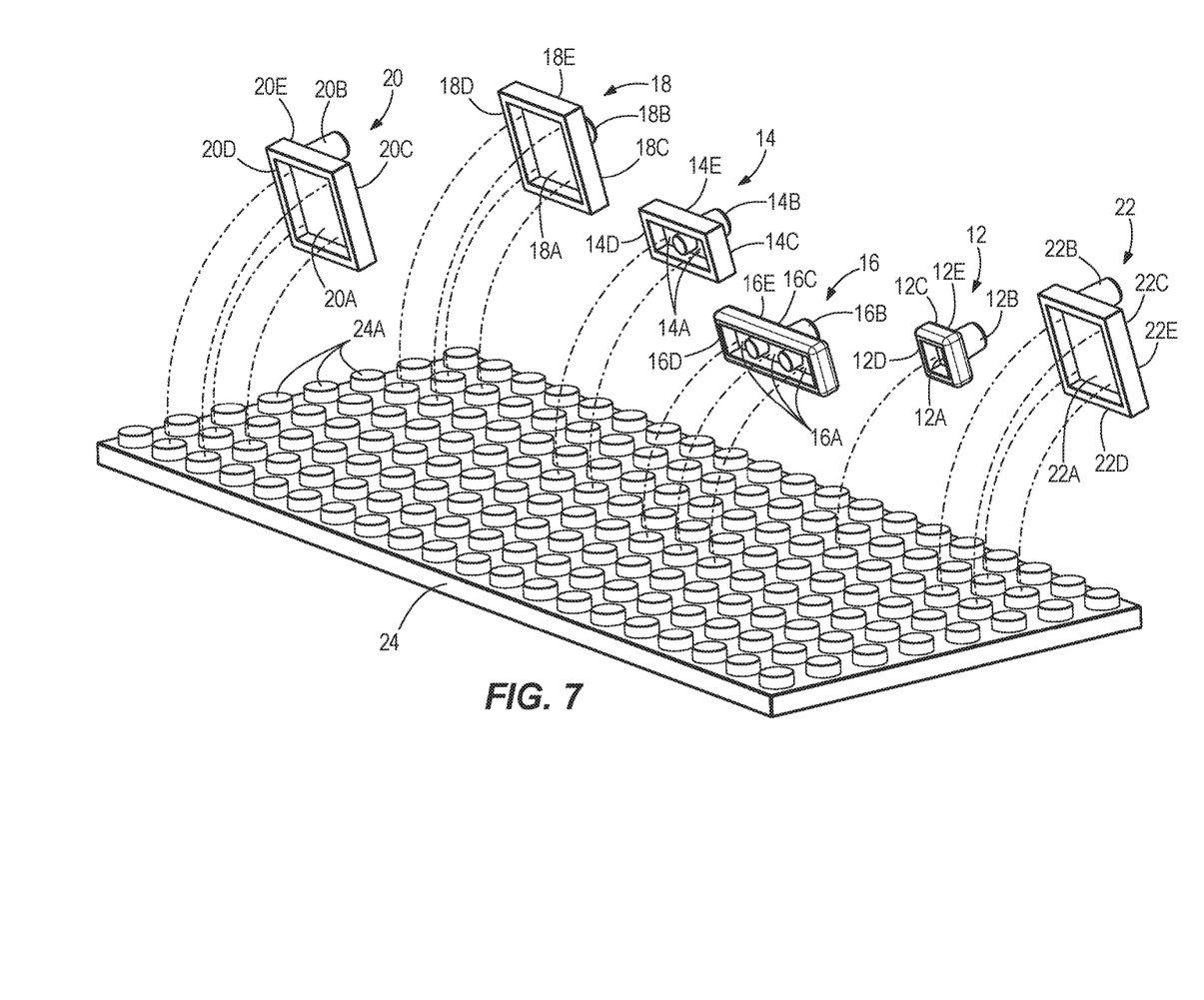
FIG. 7 illustrates a perspective view of the adapters of FIGS. 1-6 disassembled from male building block mating members of a toy building block comprising a grid.

FIGS. 1A and 1B illustrate perspective and side views of one embodiment of an adapter 12 to connect a toy building block to a snap-together electronic toy. FIGS. 2A and 2B illustrate perspective and side views of another embodiment of an adapter 14 to connect a toy building block to a snap-together electronic toy. FIGS. 3A and 3B illustrate perspective and side views of another embodiment of an adapter 16 to connect a toy building block to a snap-together electronic toy. FIGS. 4A and 4B illustrate perspective and side views of another embodiment of an adapter 18 to connect a toy building block to a snap-together electronic toy. FIGS. 5A and 5B illustrate perspective and side views of another embodiment of an adapter 20 to connect a toy building block to a snap-together electronic toy. FIGS. 6A and 6B illustrate perspective and side views of another embodiment of an adapter 22 to connect a toy building block to a snap-together electronic toy. FIG. 7 illustrates a perspective view of the adapters 12, 14, 16, 18, 20, and 22 of FIGS. 1-6 disassembled from male building block mating members 24A of a toy building block 24 comprising a grid.

The snap-together electronic toy of the disclosure may comprise an education toy set to assist children in building electronic circuits. The snap-together electronic toy comprises a plurality of electrically conductive components, comprising one or more power sources, powered components, and connector members, which are configured to be snap-fit together to complete an electrical circuit and conduct electricity between the plurality of electrically conductive components. For purposes of this disclosure, a component is only considered to be "electrically conductive" if it is configured to conduct electricity from the component to another connected component. A component is not considered to be "electrically conductive" if it merely contains an electrically conductive member, such as a piece of metal, but is not configured to conduct electricity from the component to another connected component. Typically, the plurality of snap-fitting, electrically conductive components are made of plastic and contain one or more electrical wires connected to and attached between a plurality of snap-fitting members. The plurality of snap-fitting, electrically conductive components are typically curved rather than rectangular. In other embodiments the snap-together electronic toy may use varying type, shape, size, material, configuration, and orientation of snap-fitting, electrically conductive components.

For purposes of this disclosure, the term "snap-together", "snap-fit", or "snap-fitting" is defined as one or more flexible biasing members biasing interlocking-components into locked engagement together as known in the art. This includes all variations in snap-fits including cantilever, torsional, annular, and all other types of snap-fits known to those of ordinary skill in the art. The one or more flexible biasing members may comprise a spring, a flexible biased wire, a flexible biased member such as a flexible biased piece of plastic or metal, or any other type of flexible biased member. One snap-fit comprises interlocking female and male members which are configured to snap-together with a spring of the female member biased against the male member to interlock the female and male members. Another snap-fit comprises interlocking female and male members which are configured to snap-together with a spring of the female member biased within and against a groove of the male member to interlock the female and male members. In other embodiments the snap-fit of this disclosure may comprise any type of snap-fit known to those of ordinary skill in the art.

For purposes of this disclosure, the term "building block mating member" can signify, but is not limited to, either a female or a male mating member with the building block mating member of one of the components being a female building block mating member and the building block mating member of the other component being a male building block mating member. For purposes of this disclosure, the term "toy building block" is defined as any toy building block, including a grid, which is configured to interlockingly mate with another toy building block to build any type of structure or vehicle from the interlockingly mated building blocks. Toy building blocks typically do not use a snap-fit comprising one or more biasing members to mate. In other embodiments, toy building blocks may use a snap-fit comprising one or more biasing members to mate. As known to those of ordinary skill in the art, some examples of toy building blocks include LEGO® style building blocks and ENGINO® style building blocks which utilize non-flexible interlocking mating male and female members which lock together based on their close dimensions and friction without the use of a snap-fit comprising one or more flexible, biasing members. However, the disclosure is not limited to these types of building blocks. Toy building blocks are typically rectangular, not electrically conductive, made of plastic, and do not have any snap-fit members comprising one or more biasing members. However, in other embodiments the toy building blocks may vary in type, shape, size, material, configuration, or orientation.

The adapters of this disclosure are configured to connect a toy building block to a snap-together electronic toy which would not be able to be connected together without the adapter. The adapters typically are not electrically conductive in that they will not conduct electricity between the toy building block and the snap-together electronic toy. The adapters typically have a rectangular base member and are made of plastic. The adapters have at least one snap-fitting member configured to snap-fittingly attach to a snap-fitting member of the snap-together electronic toy. In other embodiments the adapters may vary in type, shape, size, material, configuration, or orientation.

As shown in FIGS. 1A, 1B, and 7 collectively, the adapter 12 comprises a building block mating member 12A, a snap-fitting member 12B, and a base member 12C. The building block mating member 12A comprises only one female building block mating member which is disposed on a first side 12D of the base member 12C. In other embodiments, the building block mating member 12A may comprise any number and type of building block mating members such as any number of female or male building block mating members. The only one female building block mating member 12A is configured to mate with one of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 12B comprises a male snap-fitting member centered on a second side 12E of the base member 12C. The male snap-fitting member 12B is configured to mate with a female snap-fitting member of a snap-together electronic toy. The second side 12E is opposed to the first side 12D of the base member 12C. The male snap-fitting member 12B is aligned with the only one female building block mating member 12A. In other embodiments, the male snap-fitting member 12B may not be aligned with the only one female building block mating member 12A. In still other embodiments, the snap-fitting member 12B may comprise any number and type of snap-fitting member, such as any number of male or female snap-fitting members, which are configured to mate with any number and type of snap-fitting member of a snap-together electronic toy, such as any number of female or male snap-fitting members.

As shown in FIGS. 2A, 2B, and 7 collectively, the adapter 14 comprises a building block mating member 14A, a snap-fitting member 14B, and a base member 14C. The building block mating member 14A comprises two female building block mating members which are disposed on a first side 14D of the base member 14C. In other embodiments, the building block mating member 14A may comprise any number and type of building block mating members such as any number of female or male building block mating members. The two female building block mating members 14A are configured to mate with two of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 14B comprises a male snap-fitting member centered on a second side 14E of the base member 14C. The male snap-fitting member 14B is configured to mate with a female snap-fitting member of a snap-together electronic toy. The second side 14E is opposed to the first side 14D of the base member 14C. The male snap-fitting member 14B is not aligned with either of the two female building block mating members 14A. In other embodiments, the male snap-fitting member 14B may be aligned with either of the two female building block mating members 14A. In still other embodiments, the snap-fitting member 14B may comprise any number and type of snap-fitting member, such as any number of male or female snap-fitting members, which are configured to mate with any number and type of snap-fitting member of a snap-together electronic toy, such as any number of female or male snap-fitting members.

As shown in FIGS. 3A, 3B, and 7 collectively, the adapter 16 comprises a building block mating member 16A, a snap-fitting member 16B, and a base member 16C. The building block mating member 16A comprises three female building block mating members which are disposed on a first side 16D of the base member 16C. In other embodiments, the building block mating member 16A may comprise any number and type of building block mating members such as any number of female or male building block mating members. The three female building block mating members 16A are configured to mate with three of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 16B comprises a male snap-fitting member centered on a second side 16E of the base member 16C. The male snap-fitting member 16B is configured to mate with a female snap-fitting member of a snap-together electronic toy. The second side 16E is opposed to the first side 16D of the base member 16C. The male snap-fitting member 16B is aligned with one of the three female building block mating members 16A. In other embodiments, the male snap-fitting member 16B may not be aligned with any of the three female building block mating members 16A. In still other embodiments, the snap-fitting member 16B may comprise any number and type of snap-fitting member, such as any number of male or female snap-fitting members, which are configured to mate with any number and type of snap-fitting member of a snap-together electronic toy, such as any number of female or male snap-fitting members.

As shown in FIGS. 4A, 4B, and 7 collectively, the adapter 18 comprises a building block mating member 18A, a snap-fitting member 18B, and a base member 18C. The building block mating member 18A is female and is disposed on a first side 18D of the base member 18C. In other embodiments, the building block mating member 18A may comprise any number and type of building block mating members such as any number of female or male building block mating members. The female building block mating member 18A is configured to mate with four of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 18B comprises a male snap-fitting member centered on a second side 18E of the base member 18C. The male snap-fitting member 18B is configured to mate with a female snap-fitting member of a snap-together electronic toy. The second side 18E is opposed to the first side 18D of the base member 18C. In other embodiments, the snap-fitting member 18B may comprise any number and type of snap-fitting member, such as any number of male or female snap-fitting members, which are configured to mate with any number and type of snap-fitting member of a snap-together electronic toy, such as any number of female or male snap-fitting members.

As shown in FIGS. 5A, 5B, and 7 collectively, the adapter 20 comprises a building block mating member 20A, a snap-fitting member 20B, and a base member 20C. The building block mating member 20A is female and disposed on a first side 20D of the base member 20C. In other embodiments, the building block mating member 20A may comprise any number and type of building block mating members such as any number of female or male building block mating members. The female building block mating member 20A is configured to mate with four of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 20B comprises a male snap-fitting member located on a top-side center of a second side 20E of the base member 20C. The male snap-fitting member 20B is configured to mate with a female snap-fitting member of a snap-together electronic toy. The second side 20E is opposed to the first side 20D of the base member 20C. In other embodiments, the snap-fitting member 20B may comprise any number and type of snap-fitting member, such as any number of male or female snap-fitting members, which are configured to mate with any number and type of snap-fitting member of a snap-together electronic toy, such as any number of female or male snap-fitting members.

As shown in FIGS. 6A, 6B, and 7 collectively, the adapter 22 comprises a building block mating member 22A, a snap-fitting member 22B, and a base member 22C. The building block mating member 22A is female and disposed on a first side 22D of the base member 22C. In other embodiments, the building block mating member 22A may comprise any number and type of building block mating members such as any number of female or male building block mating members. The female building block mating member 22A is configured to mate with four of the building block mating members 24A of the toy building block 24. The building block mating members 24A of the toy building block 24 comprise male building block mating members. In other embodiments, the building block mating members 24A may comprise any number and type of building block mating member such as any number of male or female building block mating members. The snap-fitting member 22B comprises a male snap-fitting member located at a corner on a second side 22E of the base member 22C. The male snap-fitting member 22B is configured to mate with a female snap-fitting member of a snap-together electronic toy. The second side 22E is opposed to the first side 22D of the base member 22C. In other embodiments, the snap-fitting member 22B may comprise any number and type of snap-fitting member, such as any number of male or female snap-fitting members, which are configured to mate with any number and type of snap-fitting member of a snap-together electronic toy, such as any number of female or male snap-fitting members.

The adapters 12, 14, 16, 18, 20, and 22 of FIGS. 1A-7 have different configurations as to where their snap-fitting members 12B, 14B, 16B, 18B, 20B, and 22B are located relative to their building block mating members 12A, 14A, 16A, 18A, 20A, and 22A which mate with the respective building block mating members 24A of the toy building block 24. This allows the user to choose the adapter 12, 14, 16, 18, 20, or 22 which contains the appropriate snap-fitting member configuration 12B, 14B, 16B, 18B, 20B, and 22B relative to its building block mating member configuration 12A, 14A, 16A, 18A, 20A, and 22A in order to place the snap-fitting member 12B, 14B, 16B, 18B, 20B, or 22B at the desired location needed to mate with the mating snap-fitting member of each component of the snap-together electronic toy being built. In other embodiments, the adapters of the disclosure can be modified in type, shape, size, configuration, orientation, or number so that they are configured to mate with any type, shape, size, configuration, orientation, or number of toy building blocks and so that they are configured to mate with any type, shape, size, configuration, orientation, or number of snap-together electronic toys. In such manner, by choosing adapters of varying type, shape, size, configuration, orientation, or number, the user can attach snap-together electronic toys of differing type, shape, size, configuration, orientation, or number to one or more toy building blocks of differing type, shape, size, configuration, orientation, or number.

Figure 8:
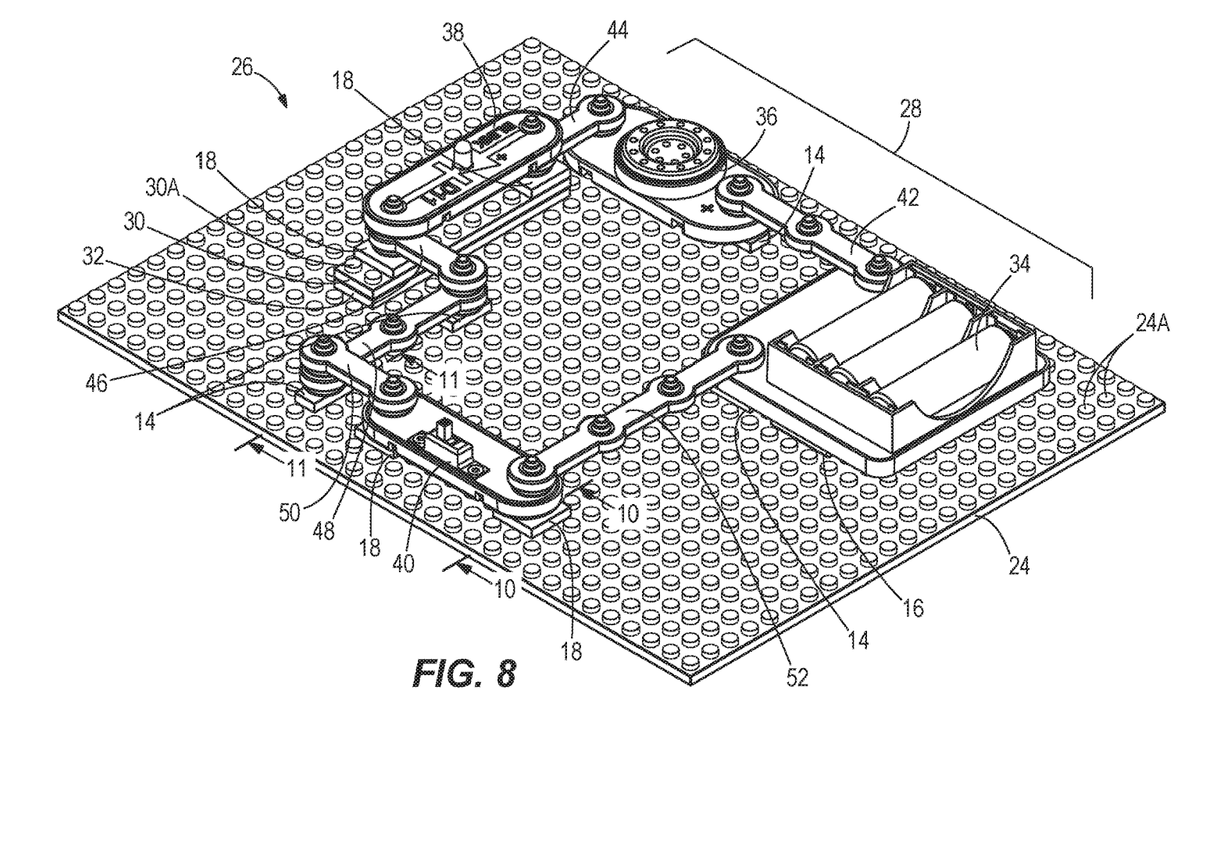
FIG. 8 illustrates a perspective view of one embodiment of an assembled toy.
Figure 9:
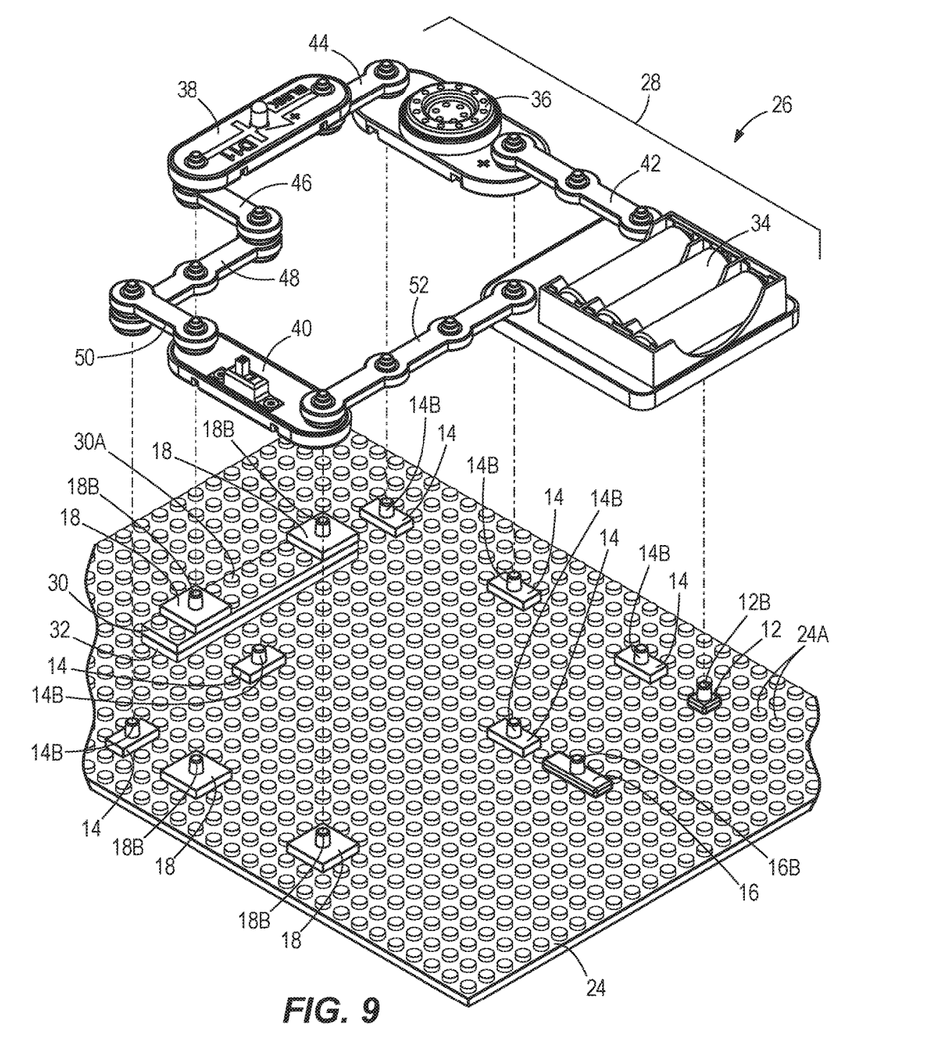
FIG. 9 illustrates a perspective view of the toy of FIG. 8 with a snap-together electronic toy separated from adapters which are attached to building block mating members of toy building blocks.
Figure 10:
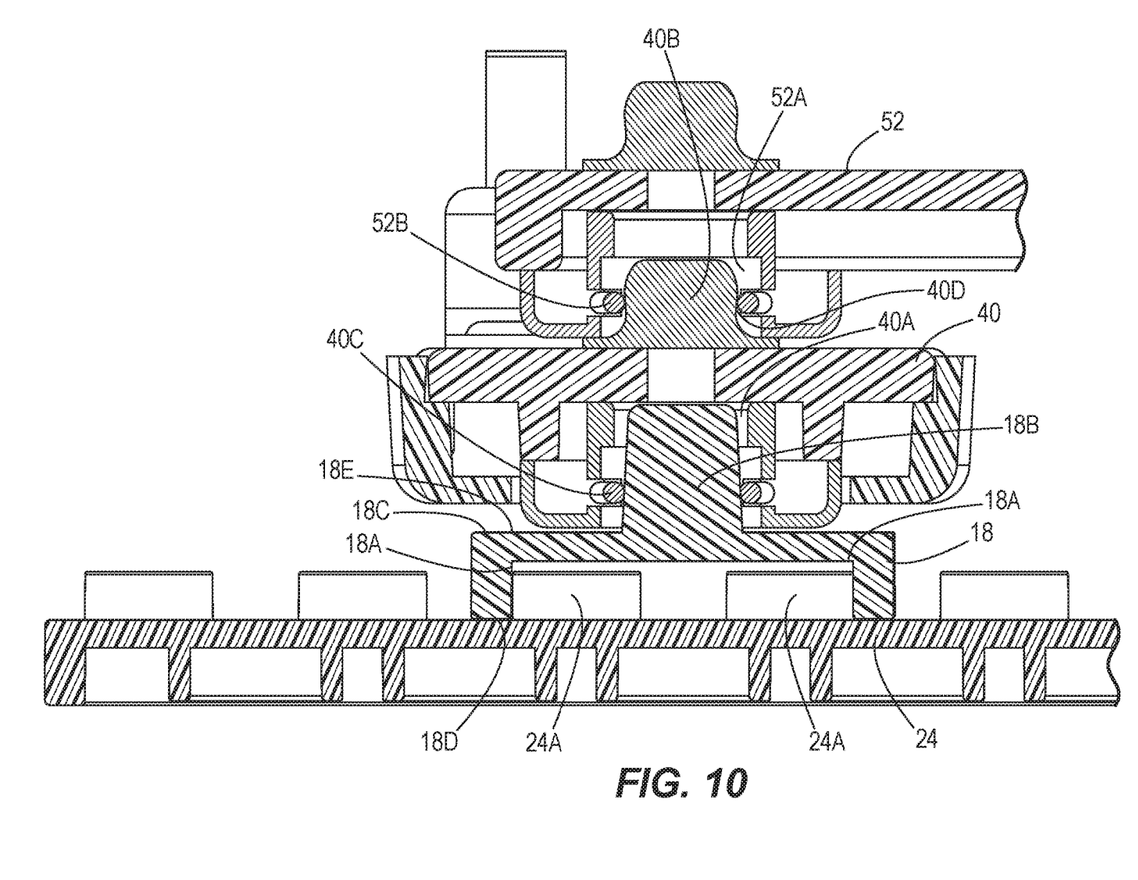
FIG. 10 illustrates a cross-section view through line 10-10 of the toy of FIG. 8.
Figure 11:
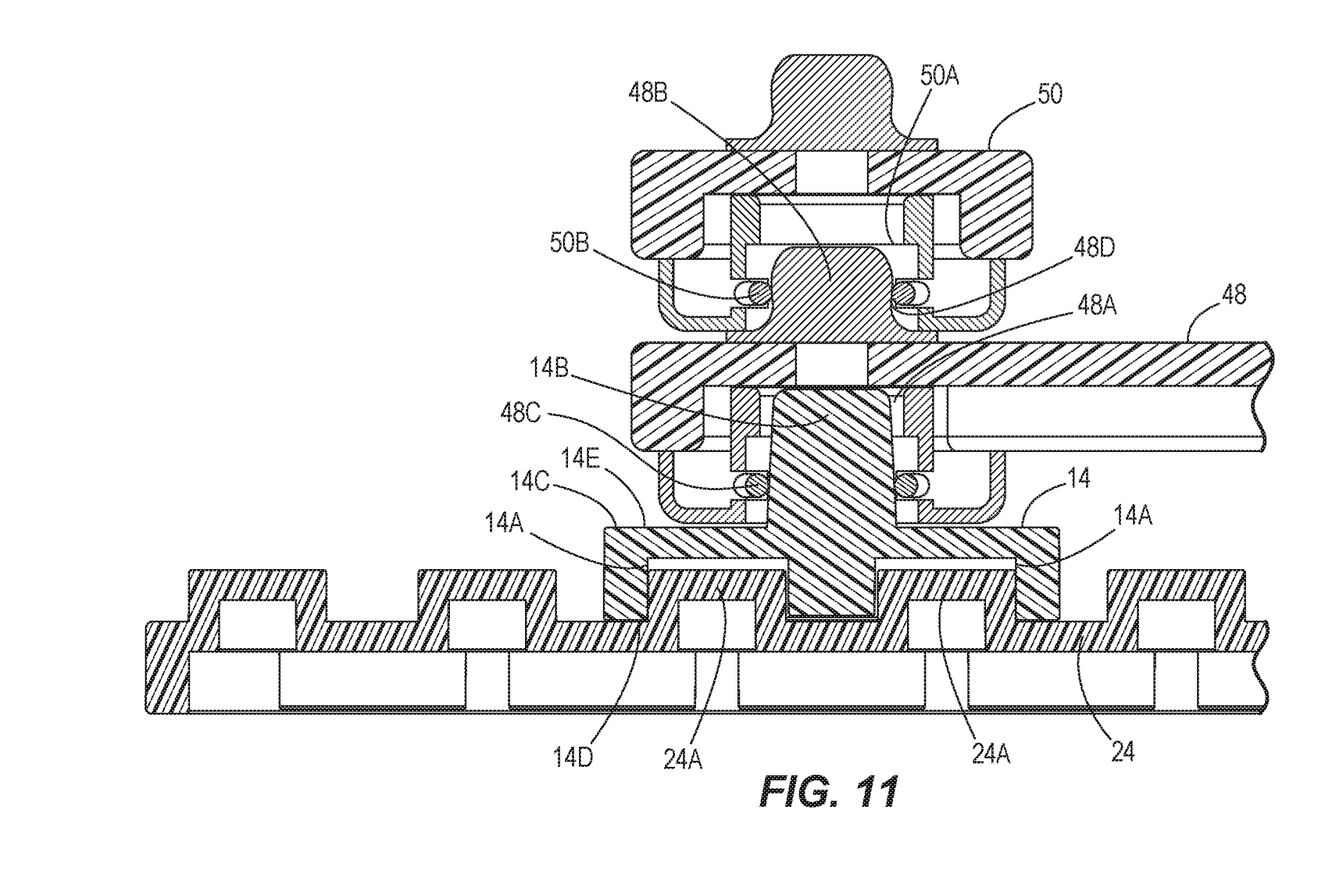
FIG. 11 illustrates a cross-section view through line 11-11 of the toy of FIG. 8.

FIG. 8 illustrates a perspective view of one embodiment of an assembled toy 26. FIG. 9 illustrates a perspective view of the toy 26 of FIG. 8 with a snap-together electronic toy 28 separated from adapters 12, 14, 16, and 18 which are attached to building block mating members 24A and 30A of toy building blocks 24 and 30. FIG. 10 illustrates a cross-section view through line 10-10 of the toy 26 of FIG. 8. FIG. 11 illustrates a cross-section view through line 11-11 of the toy 26 of FIG. 8.

As shown collectively in FIGS. 8-11, the toy 26 comprises a toy building block 24, adapters 12, 14, 16, and 18, and a snap-together electronic toy 28 which are configured to be assembled and disassembled. The toy building blocks 24, 30, and 32 comprise building block mating members 24A and 30A (the building block mating members of toy building block 32 are hidden from view). The snap-together electronic toy 28 comprises a plurality of electrical components which when assembled are electrically connected together with snap-fits to form an electrical circuit. The snap-together electronic toy comprises a power source 34, powered components 36, 38, and 40, and connecting members 42, 44, 46, 48, 50, and 52 which are all electrically connected when assembled to form the electrical circuit.

Power source 34 comprises a battery. In other embodiments, the power source 34 may comprise a solar panel, an adapter, a generator, or any other type of electrical power source. Powered component 36 comprises a sound emitting device. Powered component 38 comprises a light. Powered component 40 comprises a switch. In other embodiments, the powered components 36, 38, and 40 may comprise: a capacitor, a resistor, a diode, an inductor, a transistor, a semiconductor, a triode, a motor, a fan, a sound emitter, a speaker, a buzzer, a bell, an alarm, a microphone, a light, a switch, an integrated circuit, a computer chip, an amplifier, a modulator, a computer, a computer adapter, a telephone adapter, a motion device, a display, a visual device, an audio device, a communication device, or any other type of electrically powered component.

The adapters 12, 14, 16, and 18 are attached to the toy building block 24, which comprises a grid, with their building block mating members 12A, 14A, 16A, and 18A (shown in FIG. 7) mated to the building block mating members 24A of the toy building block 24. Toy building block 32 is attached to toy building block 24 with its building block mating members (hidden from view) mated to the building block mating members 24A of the toy building block 24. Toy building block 30 is attached to toy building block 32 with their respective building block mating members (hidden from view). Two of the adapters 18 are attached to the toy building block 30 with their building block mating members 18A (shown in FIG. 7) mated to the building block mating members 30A of the toy building block 30.

Power source 34 is snap-fittingly mated to the adapters 12, 14, and 16 through snap-fitting members 12B, 14B, and 16B of the adapters 12, 14, and 16 being mated to snap-fitting members (hidden from view) of the power source 34. Connector member 42 is snap-fittingly attached to and between the power source 34 and the powered component 36 to electrically connect them. It is noted that all of the connector members 42, 44, 46, 48, 50, and 52 have electrical wires passing to and between their snap-fitting members to transmit the electrical signal between their snap-fitting members. Connector member 44 is snap-fittingly attached to and between the powered component 36 and the powered component 38 to electrically connect them. Connector member 46 is snap-fittingly attached to and between the powered component 38 and the connector member 48 to electrically connect them. Connector member 48 is snap-fittingly attached to and between the connector member 46 and the connector member 50 to electrically connect them. Connector member 50 is snap-fittingly attached to and between the connector member 48 and the powered component 40 to electrically connect them. Connector member 52 is snap-fittingly attached to and between the powered component 40 and the power source 34 to electrically connect them.

As shown in the cross-sectional view of FIG. 10 taken along line 10-10 in FIG. 8, the toy building block mating members 24A of toy building block 24 are attached to building block mating members 18A disposed on opposed side 18D of base member 18C of adapter 18. The snap-fitting member 18B disposed on opposed side 18E of base member 18C of adapter 18 is snap-fittingly attached to snap-fitting member 40A of powered component 40 using spring 40C of powered component 40. The snap-fitting member 40B of powered component 40 is snap-fittingly attached to snap-fitting member 52A of connector member 52 using spring 52B of connector member 52 which is disposed within groove 40D of powered component 40.

As shown in the cross-sectional view of FIG. 11 taken along line 11-11 in FIG. 8, the toy building block mating members 24A of toy building block 24 are attached to building block mating members 14A disposed on opposed side 14D of base member 14C of adapter 14. The snap-fitting member 14B disposed on opposed side 14E of base member 14C of adapter 14 is snap-fittingly attached to snap-fitting member 48A of connector member 48 using spring 48C of connector member 48. The snap-fitting member 48B of connector member 48 is snap-fittingly attached to snap-fitting member 50A of connector member 50 using spring 50B of connector member 50 which is disposed within groove 48D of connector member 48.

The adapters 12, 14, 16, and 18 allow the snap-together electronic toy 26 to be attached, through the adapters 12, 14, 16, and 18, to the toy building blocks 24, 30, and 32. In other embodiments, a varying number, type, shape, size, and configuration of adapters may be used to attach varying numbers, type, shape, size, and configuration of snap-together electronic toys to varying numbers, type, shape, size, and configuration of building blocks.

Figure 12:
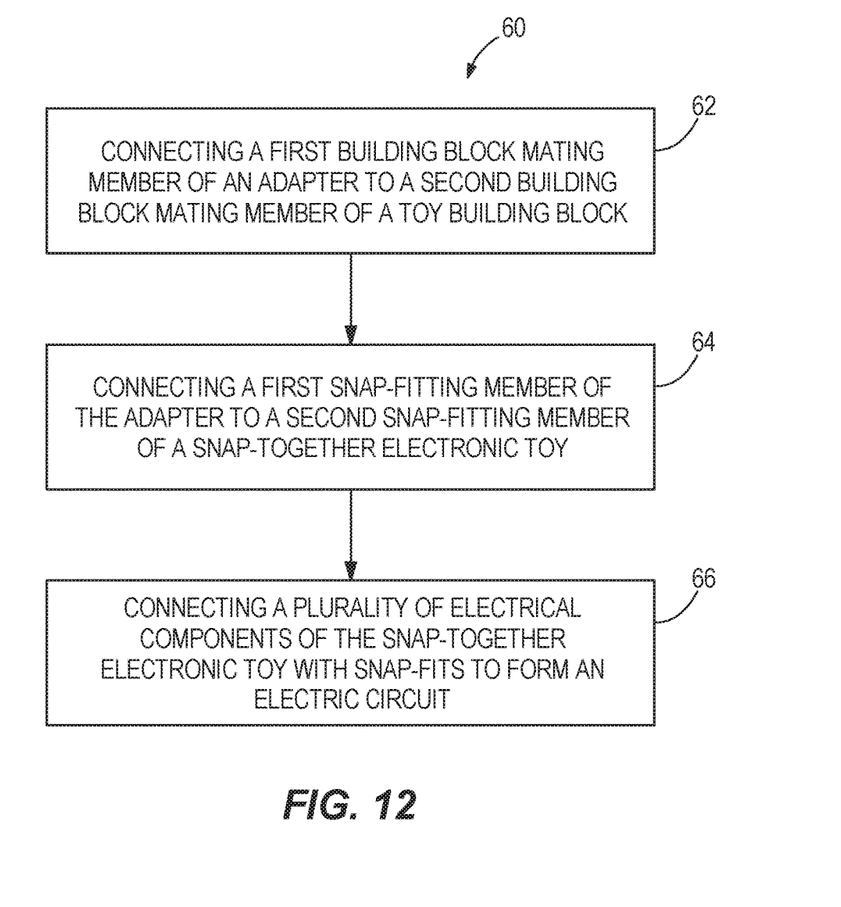
FIG. 12 illustrates one embodiment of a flowchart for a method of assembling a toy.

FIG. 12 illustrates one embodiment of a flowchart for a method 60 of assembling a toy. The method 60 may utilize any of the adapters, building blocks, and snap-together electronic toys disclosed herein. In step 62, a first building block mating member of an adapter is connected to a second building block mating member of a toy building block. In one embodiment, step 62 comprises connecting only one female building block mating member of the adapter to only one male building block mating member of the toy building block. In another embodiment, step 62 comprises connecting a plurality of female building block mating members of the adapter to a plurality of male building block mating members of the toy building block. In step 64, a first snap-fitting member of the adapter is connected to a second snap-fitting member of a snap-together electronic toy. In one embodiment, step 64 comprises connecting a male snap-fitting member of the adapter to a female snap-fitting member of the electronic toy. In step, 66 a plurality of electrical components of the snap-together electronic toy are connected with snap-fits to form an electric circuit. The plurality of electrical components of the snap-together electronic toy may comprise at least one power source and at least one powered component. In other embodiments, the plurality of electrical components of the snap-together electronic toy may vary.

In still other embodiments of the method 60, a plurality of the adapters, which may comprise different types, shapes, sizes, configurations, or orientations, may be attached between and to the toy building block and the snap-together electronic toy. In other embodiments of the method 60, one or more steps may be altered in substance or order, one or more steps may not be followed, or one or more additional steps may be added.

The disclosure allows toy building blocks and snap-together electronic toys to be attached to one another. This improves the configurability of these toys and allows countless structures to be built.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. Furthermore, it is to be understood that the disclosure is defined by the appended claims. Accordingly, the disclosure is not to be restricted except in light of the appended claims and their equivalents.

The invention claimed is:

1. A toy comprising:
a toy building block comprising a first building block mating member;
a snap-together electronic toy comprising a plurality of electrically conductive electrical components configured to be snap-fit together to collectively form a full electrical circuit, each of the plurality of electrically conductive electrical components comprising a first member and a second member, the second member comprising a biasing member, the first member of each of the plurality of electrically conductive electrical components configured to be snap-fittingly mated to the biasing member of the second member of another of the plurality of electrically conductive electrical components in order to form an electrical connection; and
an adapter configured to connect the toy building block to the snap-together electronic toy, the adapter comprising a second building block mating member which is configured to mate with the first building block mating member of the toy building block, and a member which is configured to snap-fittingly mate with the biasing member of the second member of any of the plurality of electrically conductive electrical components of the snap-together electronic toy, wherein: (1) the adapter is not electrically conductive; or (2) the second building block mating member of the adapter is not configured to snap-fittingly mate, using a flexible biasing member, to the first building block mating member of the toy building block.

2. The toy of claim 1 wherein the toy building block comprises a grid comprising a plurality of male building block mating members and the second building block mating member of the adapter comprises only one female building block mating member which is configured to mate with one of the plurality of male building block mating members of the grid.

3. The toy of claim 1 wherein the toy building block comprises a grid comprising a plurality of male building block mating members and the second building block mating member of the adapter comprises a plurality of female building block mating members which are configured to mate with the plurality of male building block mating members of the grid.

4. The toy of claim 1 wherein the second member of each of the plurality of electrically conductive electrical components comprises a female member, and the member of the adapter is a male member.

5. The toy of claim 1 wherein the plurality of electrically conductive electrical components comprise at least one power source and at least one powered component.

6. The toy of claim 5 wherein the at least one power source is selected from the group of: a battery, a solar panel, an adapter, a generator, or another electrical power source.

7. The toy of claim 5 wherein the at least one powered component is selected from the group of: a capacitor, a resistor, a diode, an inductor, a transistor, a semiconductor, a triode, a motor, a fan, a sound emitter, a speaker, a buzzer, a bell, an alarm, a microphone, a light, a switch, an integrated circuit, a computer chip, an amplifier, a modulator, a computer, a computer adapter, a telephone adapter, a motion device, a display, a visual device, an audio device, a communication device, or another electrically powered component.

8. The toy of claim 1 comprising a plurality of the adapter, the plurality of the adapter configured to connect the toy building block to the snap-together electronic toy.

9. The toy of claim 8 wherein at least two of the plurality of the adapter are of different size or shape.

10. The toy of claim 1 wherein (2) the second building block mating member of the adapter is not configured to snap-fittingly mate, using the flexible biasing member, with the first building block mating member of the toy building block.

11. The toy of claim 1 wherein (1) the adapter is not electrically conductive.

12. A toy comprising:
   a toy building block comprising a first building block mating member;
   a snap-together electronic toy comprising a plurality of electrically conductive electrical components snap-fit together with snap-fitting members, each snap-fit comprising a biasing member, the plurality of electrically conductive electrical components electrically connected forming a full electrical circuit; and
   an adapter connecting the toy building block to the snap-together electronic toy, a second building block mating member of the adapter mated with the first building block mating member of the toy building block, and a member of the adapter snap-fittingly mated with one of the snap-fitting members of the plurality of electrically conductive electrical components of the snap-together electronic toy, wherein: (1) the adapter is not electrically conductive; or (2) the second building block mating member of the adapter is not snap-fittingly mated, using a flexible biasing member, to the first building block mating member of the toy building block.

13. The toy of claim 12 wherein the toy building block comprises a grid comprising a plurality of male building block mating members and the second building block mating member of the adapter comprises only one female building block mating member which is mated with one of the plurality of male building block mating members of the grid.

14. The toy of claim 12 wherein the toy building block comprises a grid comprising a plurality of male building block mating members and the second building block mating member of the adapter comprises a plurality of female building block mating members which are mated with the plurality of male building block mating members of the grid.

15. The toy of claim 12 wherein the biasing member of each snap-fit comprises a portion of a female snap-fitting member of each of the plurality of electrically conductive electrically components, and the member of the adapter comprises a male member.

16. The toy of claim 12 wherein the plurality of electrically conductive electrical components comprise at least one power source and at least one powered component.

17. The toy of claim 16 wherein the at least one power source is selected from the group of: a battery, a solar panel, an adapter, a generator, or another electrical power source.

18. The toy of claim 16 wherein the at least one powered component is selected from the group of: a capacitor, a resistor, a diode, an inductor, a transistor, a semiconductor, a triode, a motor, a fan, a sound emitter, a speaker, a buzzer, a bell, an alarm, a microphone, a light, a switch, an integrated circuit, a computer chip, an amplifier, a modulator, a computer, a computer adapter, a telephone adapter, a motion device, a display, a visual device, an audio device, a communication device, or another electrically powered component.

19. The toy of claim 12 comprising a plurality of the adapter, the plurality of the adapter connecting the toy building block to the snap-together electronic toy.

20. The toy of claim 19 wherein at least two of the plurality of the adapter are of different size or shape.

21. The toy of claim 12 wherein (2) the second building block mating member of the adapter is not snap-fittingly mated, using the flexible biasing member, with the first building block mating member of the toy building block.

22. The toy of claim 12 wherein (1) the adapter is not electrically conductive.

* * * * *